(12) United States Patent
Nomura

(10) Patent No.: US 6,554,879 B1
(45) Date of Patent: Apr. 29, 2003

(54) TRAP APPARATUS

(75) Inventor: Norihiko Nomura, Fujisawa (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/630,639

(22) Filed: Aug. 1, 2000

(30) Foreign Application Priority Data

| Aug. 3, 1999 | (JP) | 11-220132 |
| Sep. 8, 1999 | (JP) | 11-254070 |
| Mar. 7, 2000 | (JP) | 2000-062588 |
| Jul. 3, 2000 | (JP) | 2000-201511 |
| Jul. 6, 2000 | (JP) | 2000-205634 |

(51) Int. Cl.[7] .............. F04B 37/16; B01D 8/00; H01L 21/31

(52) U.S. Cl. .......... 55/385.1; 55/385.2; 55/445; 55/446; 55/457; 55/502; 96/416; 96/420

(58) Field of Search .......... 55/385.1, 385.2, 55/423, 444, 445, 446, 452, 456, 457, 502; 96/416, 420

(56) References Cited

U.S. PATENT DOCUMENTS

| 5,334,239 A | * | 8/1994 | Choe et al. .............. 95/261 |
| 5,422,081 A | * | 6/1995 | Miyagi et al. .............. 55/486 |
| 5,788,747 A | * | 8/1998 | Horiuchi et al. .......... 55/385.1 |
| 5,819,683 A | * | 10/1998 | Ikeda et al. .............. 118/724 |
| 6,093,228 A | * | 7/2000 | Wang .......... 55/385.1 |
| 6,156,107 A | * | 12/2000 | Hayashi et al. .......... 55/385.1 |
| 6,168,517 B1 | * | 1/2001 | Cook .............. 55/467 |

FOREIGN PATENT DOCUMENTS

| EP | 847789 | 6/1998 |
| EP | 1050681 | 11/2000 |
| JP | 58-106186 | 6/1983 |
| JP | 60-071002 | 4/1985 |
| JP | 10-266957 | 10/1998 |
| JP | 10-266962 | 10/1998 |
| JP | 11-182425 | 7/1999 |
| JP | 11-210621 | 8/1999 |

OTHER PUBLICATIONS

Patent Abstracts of Japan, vol. 1999, No. 01, Jan. 29, 1999, & JP 10–266956 A (Ebara Corp.), Oct. 6, 1998.

* cited by examiner

Primary Examiner—David A. Simmons
Assistant Examiner—Minh-Chau T. Pham
(74) Attorney, Agent, or Firm—Armstrong, Westerman & Hattori, LLP

(57) ABSTRACT

A trap apparatus includes a discharge path for evacuating a hermetically sealed chamber through a vacuum pump, a hermetically sealed trap container extended across the discharge path and a regeneration path disposed adjacent to the discharge path, a trap unit disposed in the trap container for attaching a product in a discharged gas thereon and removing the product form the discharged gas, the trap unit being selectively located at the discharge path or the regeneration path, a valve element disposed on both sides of the trap unit and being movable integrally with the trap unit, and a sealing material mounted on an outer circumferential surface of the valve element so as to slide over an inner circumferential surface of the trap container when the trap unit is moved.

4 Claims, 14 Drawing Sheets

TRAP APPARATUS

BACKGROUND OF THE INVENTION

1. Field of the Invention

The present invention relates to a trap apparatus for use in an evacuating system for evacuating a vacuum chamber for a semiconductor fabrication apparatus or the like.

2. Description of the Related Art

A conventional evacuating system will be described below with reference to FIG. 16. In FIG. 16, a hermetically sealed chamber 201 comprises a process chamber for use in a semiconductor fabrication process such as an etching apparatus or a chemical vapor deposition (CVD) apparatus. The hermetically sealed chamber 201 is connected to a vacuum pump 203 through a discharge path 202. The vacuum pump 203 serves to increase the pressure of gases discharged from the process in the hermetically sealed chamber 201 to the atmospheric pressure. An oil-sealed rotary vacuum pump has heretofore been used as the vacuum pump 203. A dry pump is mainly used as the vacuum pump 203 at present.

If the degree of vacuum required by the hermetically sealed chamber 201 is higher than the ultimate vacuum of the vacuum pump 203, then an ultra-high vacuum pump such as a turbo-molecular pump is additionally disposed upstream of the vacuum pump 203. A discharged gas processing apparatus 204 is disposed downstream of the vacuum pump 203. In the discharged gas processing apparatus 204, gas components that cannot directly be discharged into the atmosphere because of their toxicity or explosive properties depending on the type of the process are treated by a process such as adsorption, decomposition, or absorption. Only harmless gases are discharged from the discharged gas processing apparatus 204 into the atmosphere. Necessary valves are provided at appropriate locations of the discharge path 202.

The conventional evacuating system has the following disadvantages.

In the conventional evacuating system, if reaction by-products contain a substance having a high sublimation temperature, then the gas of the substance is solidified while its pressure is being increased, and deposited in the vacuum pump. This tends to cause a failure of the vacuum pump.

For example, when $BCl_3$ or $Cl_2$ which is a typical process gas for aluminum etching is used, the process chamber discharges the remainder of the process gas of $BCl_3$ or $Cl_2$ and a reaction by-product of $AlCl_3$ via the vacuum pump. $AlCl_3$ is not deposited at the suction side of the vacuum pump because its partial pressure is low. However, while $AlCl_3$ is being discharged under pressure, its partial pressure rises to cause $AlCl_3$ to be deposited and attached to the inner wall of the vacuum pump, resulting in a failure of the vacuum pump. The same problem occurs with reaction by-products such as $(NH_4)_2SiF_6$ and $NH_4Cl$ that are produced in a CVD apparatus for depositing films of SiN.

It has heretofore been attempted to heat the vacuum pump to pass the reaction by-products in gaseous state through the vacuum pump so that no solid substance is deposited in the vacuum pump. The attempt has been effective to prevent a solid substance from being deposited in the vacuum pump. However, it has been problematic in that a solid substance is deposited in the discharged gas processing apparatus disposed downstream of the vacuum pump, thereby clogging a filled layer in the discharged gas processing apparatus.

One solution is to install a trap apparatus upstream or downstream of the pump. The trap apparatus attaches products to a trap unit disposed in the trap apparatus, and hence previously removes portions (components) which will generate solid substances, for thereby protecting various devices provided at the discharge path. In general, however, the conventional trap apparatus has a poor trapping efficiency, and about 60% of the components of discharged gases flow through the trap apparatus without being attached to the trap unit and are attached to downstream pipes and devices. This is mainly because the discharged gases flow through a portion having a poor trapping efficiency between the inner wall of a container and the trap unit in the trap apparatus, and pass through the trap apparatus without being trapped.

SUMMARY OF THE INVENTION

The present invention has been made in view of the above drawbacks. It is therefore an object of the present invention to provide a trap apparatus which, in a film deposition process or the like, can increase the trapping efficiency while the necessary conductance on the hermetically sealed chamber side is being maintained, and increase the service life of the vacuum pump, protect a toxic substance removing device, and, in addition, can reduce the equipment cost and the running cost.

According to a first aspect of the present invention, there is provided a trap apparatus comprising: a discharge path for evacuating a hermetically sealed chamber through a vacuum pump; a hermetically sealed trap container extended across the discharge path and a regeneration path disposed adjacent to the discharge path; a trap unit disposed in the trap container for attaching a product in a discharged gas thereon and removing the product from the discharged gas, the trap unit being selectively located at the discharge path or the regeneration path; a valve element disposed on both sides of the trap unit and being movable integrally with the trap unit; and a sealing material mounted on an outer circumferential surface of the valve element so as to slide over an inner circumferential surface of the trap container when the trap unit is moved.

With the above arrangement, since the outer diameter of the trap unit can be designed to a near value to the inner diameter of the trap container, the contact efficiency of the discharged gas introduced into the trap container with the trap unit can be increased. Therefore, the trapping efficiency of products in the discharged gas can be increased while the conductance of the discharged gas and a predetermined exhaust capacity are being maintained without affecting the performance of the process in the hermetically sealed chamber or the vacuum pump. Further, since the trap unit is selectively located at the discharge path or the regeneration path, the regeneration of the trap to be carried out in an in-line manner, and hence the trap regeneration work can be simplified.

The hermetically sealed chamber may comprise a process chamber for a semiconductor fabrication device or the like. If necessary, a discharged gas processing apparatus for removing a toxic substance from a process gas is provided. The vacuum pump preferably comprises a dry pump which uses no lubricating oil in the discharge path in order to prevent contamination of the chamber caused by the back-diffusion of oil.

According to a second aspect of the present invention, there is provided a trap apparatus, wherein at least two trap units are disposed in the trap container to perform a trapping operation in the discharge path and a regenerating operation in the regeneration path simultaneously.

With the above arrangement, since it is not necessary to stop the device for the regeneration of the trap unit and to prepare a trap unit for replacement even in the case of operation for a long period of time, a continuous stable operation can be achieved in the hermetically sealed chamber. Further, it is easy to fully automate the system by using a suitable means for controlling timing of the switching.

When the trap unit is used as a temperature trap unit, a heat medium may be externally introduced into the trap unit. Heat of gasification of liquefied gas (for example, liquid nitrogen), cooling water, or a coolant is used as the heat medium. In another method, a thermoelectric element (a Peltier element), a pulse tube refrigerator, or the like is used to generate low temperature at the trap unit without the flow of any heat medium per se.

In the regeneration section as in the case of the trap unit, a heat medium may be used, or alternatively a heater, a thermoelectric element, spontaneous temperature rising or the like may be used. In the regeneration operation, a heat medium for regeneration (generally gas) may follow a regenerated gas or the like. Alternatively, the heat medium and the regenerated gas are recovered separately from each other. In the latter case, a regeneration medium path is separately provided.

An air cylinder may switch and drive the trap unit. In this case, an air-driven control unit comprising a solenoid valve and a speed controller may be used for control. Further, the air-driven control unit may be controlled by a sequencer or a control signal through a relay.

Methods for performing switching of the trap unit in a full automatic manner without manual operation include, for example, a method in which a sensor for detecting a pressure difference between a pressure before the trap unit and a pressure after the trap unit is provided and, when the detected value reaches a predetermined value, switching is carried out, and a more practical method in which a suitable switching time is preset. When one discharge path is provided for one regeneration path, since the trapping time is identical to the regeneration time, the capability for regeneration is preferably made higher than the capability for trapping so that the regeneration operation is completed earlier than the trapping operation.

According to a third aspect of the present invention, there is provided a trap apparatus, wherein the sealing material is mounted on an outer circumferential surface of the valve element so as to be expanded toward an inner circumferential surface of the trap container. Expanding the sealing material radially to bring the sealing material into close contact with the inner circumferential surface of the trap container can ensure sufficient hermetical sealing when the valve element is in a stop state (a sealed state).

When the valve element is moved, the sealing material is contracted radially to reduce the protrusion of the sealing material from the outer circumferential surface of the valve element. Thus, loads caused by sliding at the time of movement of the valve elements can be reduced, so that durability of the sealing materials can be increased.

In a preferred aspect of the present invention, the sealing material is brought into pressure contact with an inner circumferential surface of the trap container only when the sealing material is expanded radially. With the above arrangement, sufficient hermetical sealing can be achieved when the valve element is in a stop state (a sealed state). When the valve element is moved, loads on the sealing section can be minimized.

According to a fourth aspect of the present invention, there is provided a trap apparatus, wherein the valve element comprises means for radially expanding the sealing material by pressing the sealing material outwardly. With the above arrangement, the interior of the valve element can effectively be utilized, and hence a compact trap apparatus can be achieved.

In a preferred aspect of the present invention, the means for radially expanding the sealing material relatively moves a pair of members facing with each other or a pair of members having a tapered surface away from and nearer to each other, the tapered surface facing with each other and having a V shape extending outwardly in horizontal cross-section.

With the above arrangement, mechanically bringing a pair of members close to each other permits the sealing material to be expanded radially via vertical surfaces or tapered surfaces. Further, moving a pair of the members away from each other permits the sealing material to be contracted radially by the elastic force of the sealing material.

According to a fifth aspect of the present invention, there is provided a trap apparatus comprising: a discharge path for evacuating a hermetically sealed chamber through a vacuum pump; a hermetically sealed trap container having an inlet and an outlet and constituting a part of the discharge path; a trap unit disposed in the trap container for attaching a product in a discharged gas thereon and removing the product from the discharged gas; and a throttle section disposed at a suction port of the trap container for regulating a flow of a discharged gas in the suction port such that the discharged gas flows toward the inside of the trap unit.

With the above arrangement, the flow of the discharged gas is regulated at the throttle section so as to flow toward the inside of the trap unit, and introduced through the inlet into the trap container, and then spreads again and flows through the trap container. Therefore, a large part of the discharged gas can be surely brought into contact with the trap unit to increase the trapping efficiency without significant lowering in conductance. The opening area of the throttle section is preferably about 80% to about 90% of the area of the passage at the inlet in the trap container.

According to a sixth aspect of the present invention, there is provided a trap apparatus comprising: a discharge path for evacuating a hermetically sealed chamber through a vacuum pump; a hermetically sealed trap container having an inlet and an outlet and constituting a part of the discharge path; a trap unit disposed in the trap container for attaching a product in a discharged gas thereon and removing the product from the discharged gas; and a suppression section disposed at a discharge port of the trap container for suppressing a flow of a discharged gas in the discharge port.

With the above arrangement, the flow of the discharged gas introduced into the trap container can be suppressed, and hence does not flow smoothly from the outlet of the trap container. Therefore, the discharged gas stays within the trap container for a longer period of time, and hence the trapping efficiency can be increased by a longer period of contact of the discharged gas with the trap unit.

In a preferred aspect of the present invention, the trap unit may comprise a baffle plate having a curved trap surface. With the arrangement, a curved trap passage is formed to increase the probability that gas molecules in the discharged gas collide with the trap surface, thereby increasing the trapping efficiency.

In this case, the trap surface is preferably in the shape of an arc and an axis of the arc crosses the discharge path. With the above arrangement, a baffle plate having a curved trap surface is formed in a relatively simple way.

The above and other objects, features, and advantages of the present invention will be apparent from the following description when taken in conjunction with the accompanying drawings which illustrates preferred embodiments of the present invention by way of example.

DETAILED DESCRIPTION OF THE PREFERRED EMBODIMENTS

Figure 1:
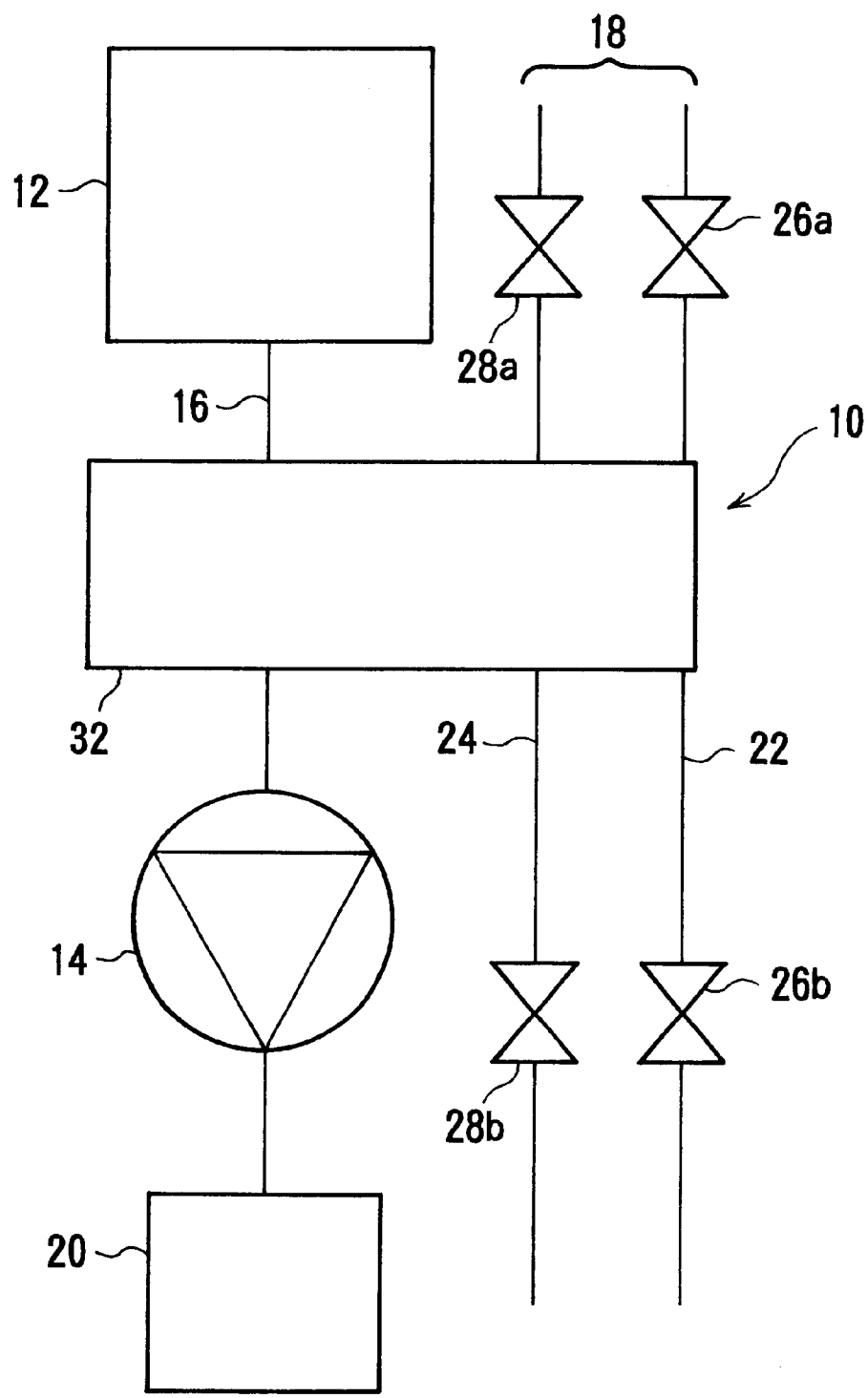
FIG. 1 is a systematic diagram showing an evacuating system having a trap apparatus according to a first embodiment of the present invention.

A trap apparatus according to embodiments of the present invention will be described below with reference to the accompanying drawings. Like or corresponding parts are denoted by like or corresponding reference numerals throughout views.

Figure 2A:
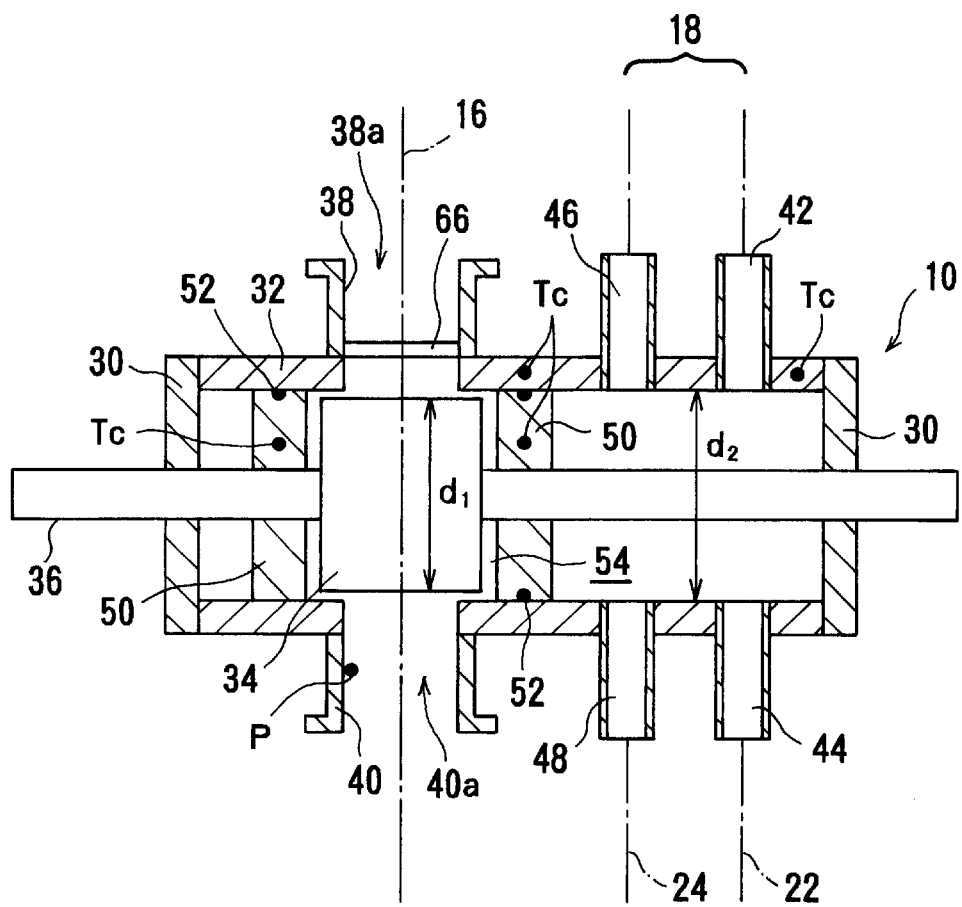
FIG. 2A is a sectional side view of the trap apparatus shown in FIG. 1.
Figure 2B:
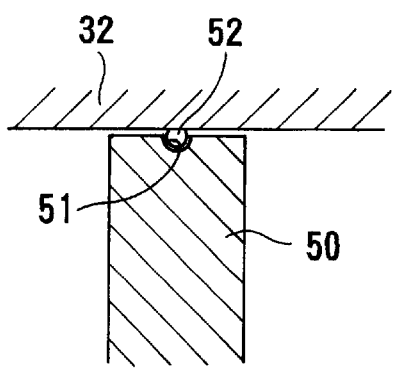
FIG. 2B is a partially enlarged view of the trap apparatus shown in FIG. 2A.
Figure 3:
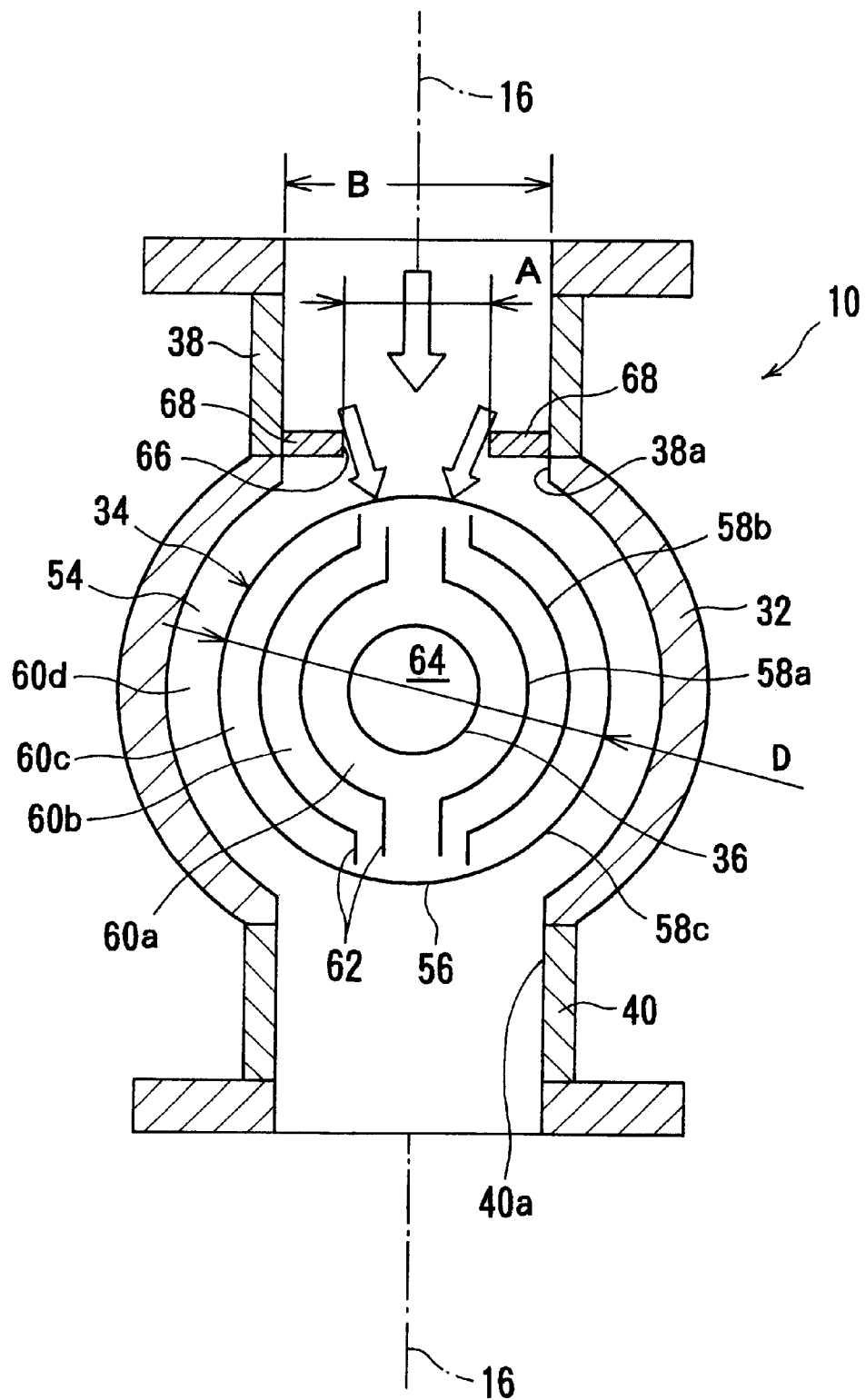
FIG. 3 is a sectional front view of the trap apparatus shown in FIG. 1.

FIGS. 1 through 3 show a trap apparatus according to a first embodiment of the present invention. The trap apparatus 10 is extended across a discharge path 16 for evacuating a hermetically sealed chamber 12 by a vacuum pump 14 and a regeneration path 18 disposed adjacent to the discharge path 16. In this embodiment, the vacuum pump 14 is a single stage vacuum pump. Alternatively, a multi-stage vacuum pump may be used. A discharged gas processing apparatus 20 for removing a toxic substance from the discharged gas is disposed downstream of the vacuum pump 14. The regeneration path 18 has a line 22 for a cleaning liquid and a line 24 for a drying gas. In the cleaning liquid line 22, control valves 26a and 26b are provided respectively on its introduction side and discharge side. In the drying gas line 24, control valves 28a and 28b are provided respectively on its suction side and discharge side.

As shown in FIGS. 2A and 2B, the trap apparatus 10 comprises an approximately cylindrical trap container 32, both ends of which are hermetically closed by blocking plates 30, a shaft 36 piercing through the trap container 32 along the axis of the trap container 32, a trap unit 34 mounted on the shaft 36 and disposed in the trap container 32, and an air cylinder (not shown) as driving means for reciprocating the shaft 36 along the axis of the trap container 32. An inlet pipe 38 and an outlet pipe 40 communicated to the discharge path 16 are connected to the trap container 32 respectively via an inlet 38a and an outlet 40a. Further, the trap container 32 is provided with a cleaning liquid inlet port 42 and a cleaning liquid outlet port 44 communicated to the cleaning liquid line 22, and a drying gas purge port 46 and a drying gas discharge port 48 communicated to the drying gas line 24.

A pair of disk-like valve elements 50, 50 are fixed on the shaft 36. Each of the elements 50 is located at both sides of the trap unit 34 and has a slightly smaller outer diameter than the inner diameter of the trap container 32. As shown in FIG. 2B, a seal mounting groove 51 is formed over the whole outer circumferential surface of each of the valve elements 50, and a sealing material 52 is mounted on the seal mounting groove 51. For example, an O-ring or a cap seal is preferably used as the sealing material 52. Each of the sealing materials 52 has such a thickness that the sealing material 52 is compressed by the seal mounting groove 51 and the inner circumferential surface of the trap container 32 when the sealing material is mounted on the seal mounting groove 51. Close contact of the sealing material 52 with the inner circumferential surface of the trap container 32 can seal a gap between the inner circumferential surface of the trap container 32 and the outer circumferential surface of the valve element 50. By coating the inner circumferential surface of the trap container 32 with Teflon or the like, it is easier to slide the valve elements 50, and also chemical resistance can be enhanced.

With the above arrangement, a hermetically sealed trap/ regeneration chamber 54 having a trap unit 34 therein is defined between a pair of the valve elements 50, 50 in the trap container 32. The trap/regeneration chamber 54 serves as a trap chamber when the trap unit 34 is located at a discharge position corresponding to the discharge path 16, while the trap/regeneration chamber 54 serves as a regeneration chamber when the trap unit 34 is located at a regeneration position corresponding to the regeneration path 18.

Thus, the sealing material 52 provided on the outer circumferential surface of the valve element 50 can eliminate a member protruding inside from the inner circumferential surface of the trap container 32 for defining between the trap position and the regeneration position. Therefore, even if the outer diameter $d_1$ of the trap unit 34 is substantially identical to the inner diameter $d_2$ of the trap container 32, the movement of the trap unit 34 is not prevented. The space between the trap unit 34 and the trap container 32 is so small that the proportion of the discharged gas which flows bypassing the trap unit 34 without contact with the trap unit 34 to the whole introduced gas can be reduced. This can increase the trapping efficiency.

A temperature sensor (Tc) is provided at a predetermined position of the trap unit 34, and a pressure sensor (P) is provided upstream or downstream of the trap unit 34 at the discharge path 16. The temperature and the pressure difference can be detected by these sensors.

As shown in FIG. 3, the trap unit 34 comprises a pair of end plates 56 mounted on the shaft 36 in axially confronting relation to each other, and baffle plates 58a, 58b, 58c extending between these end plates 56. A plurality of the baffle plates 58a, 58b, 58c (six plates in total in the embodiment shown in FIG. 3) are disposed in a horizontal symmetric pattern, thus defining trap passages 60a, 60b, 60c, 60d between adjacent baffle plates, between the baffle plate 58a and the shaft 36, and between the baffle plate 58c and the inner wall of the trap container 32 for communicating between the upper part and lower part of the trap container 32. In this embodiment, the baffle plates 58a, 58b, 58c have an approximately semicircular shape in the horizontal cross-section and are disposed concentrically with the shaft 36. Thus, the trap passages 60a, 60b, 60c, 60d are formed as bypasses around the shaft 36.

Vertically extended guide sections 62 are provided at the upper and lower ends of the centered baffle plates 58a, 58b. The baffle plates 58a, 58b, 58c and the end plate 56 are made of a material having a good heat conductivity. The baffle plates 58a, 58b, 58c are cooled by heat conduction with the shaft 36 via the end plate 56.

The shaft 36 has a passage 64 for a cooling heat medium defined therein. A cooling heat medium comprising liquid such as liquid nitrogen, cooled air or water is supplied to the heat medium passage 64.

A pair of regulating plates 68, 68 are disposed at the inlet 38a of the trap container 32, and constitute an orifice 66 as a throttle section for narrowing the inlet 38a in the width direction. The width A of the orifice (throttle section) 66 is designed to be substantially the same as the opening width of the outermost baffle plate 58c. The ratio A/B of the width A of the gap between the regulating plates 68, 68 to the width B of the inlet pipe 38, i.e., reduction of area, is about 80% to about 90%.

Operation the trap apparatus thus constructed will be described below. As shown in FIG. 2A, when the trap unit 34 is located at a position in the discharge path 16, the trap/regeneration chamber 54 serves as a trap chamber. A cooling heat medium such as liquid nitrogen flows through the heat medium passage 64 in the shaft 36 to cool the trap unit 34.

When the vacuum pump 14 is operated, a gas discharged from the hermetically sealed chamber 12 is introduced into the trap container 32 via the discharge path 16. The discharged gas flows through the inlet pipe 38 and reaches the orifice (regulating section) 66 defined by the regulating plates 68, 68. The orifice 66 reduces the flow width of the discharged gas and simultaneously increases the flow velocity of the discharged gas. Then, the discharged gas flows into the trap container 32.

The discharged gas flowing out of the orifice 66 flows downstream while its flow width is being increased. A part of the discharged gas flows through the trap passages 60a, 60b, 60c provided on the center side. The remaining discharged gas flows through the outermost trap passage 60d. The discharged gas which has flown along the curved trap passages 60a, 60b, 60c, 60d defined by the baffle plates 58a, 58b, 58c is cooled upon collision with the baffle plates 58a, 58b, 58c. Components in the discharged gas which can easily be coagulated are deposited thereon and attached to the inner and outer surfaces of the baffle plates 58a, 58b, 58c.

In this embodiment, since the flow width of the discharged gas is reduced by the orifice 66, the proportion of discharged gas which flows through the trap passages 60a, 60b, 60c on the center side to the whole discharged gas is increased. In the trap passage 60d provided on the outer side, only the baffle plate 58c facing the trap container 32 heated for the prevention of deposition serves to cool the discharged gas. Therefore, the trapping efficiency for the trap passage 60d is smaller than that for the other trap passages 60a, 60b, 60c. Thus, the trapping efficiency of the entire trap unit can be improved by increasing the proportion of discharged gas which flows through the trap passages 60a, 60b, 60c on the center side to the whole discharged gas.

Further, the discharged gas which flows out of the orifice 66 has a velocity component which spreads in the width direction. Therefore, the probability that the discharged gas collides with the inner side of the baffle plates 58a, 58b, 58c in the upper side of the trap unit 34 is increased. This can improve the attachment efficiency in the entire trap unit.

Further, in this embodiment, since the trap passages 60a, 60b, 60c, 60d are curved in the shape of an arc, the probability that gas molecules in the discharged gas collide with the trap surface constituted by the inner and outer surfaces of the baffle plates 58a, 58b, 58c is increased, and hence the trapping efficiency of the gas molecules can be increased. This trapping action is effectively not only for tapping gas molecules by cooling, but also for tapping particles on the trap surface by adsorption.

Furthermore, since the outer diameter $d_1$ of the trap unit 34 can be designed to be a near value to the inner diameter $d_2$ of the trap container 32, the proportion of discharged gas which flows bypassing the trap unit 34 without contact with the trap unit 34 to the whole introduced discharged gas is small. Therefore, the trapping efficiency of products in the discharged gas can be increased while the conductance of the trap apparatus is being maintained. The present inventors made an experiment on trapping of $NH_4Cl$. As a result, a trapping efficiency of 98% could be achieved. Further, it was confirmed that the level of the conductance in this case was good enough not to pose any problem associated with the operation of a semiconductor fabrication apparatus.

When the tapping operation is completed, the cooling of the trap unit 34 is stopped, and the air cylinder is operated to move the shaft 36, for thereby moving the trap unit 34 to the regeneration path 18 side. In such a state that the cleaning liquid line 22 and the drying gas line 24 are communicated with the trap/regeneration chamber 54, a cleaning liquid is introduced from a cleaning liquid inlet port 42 into the trap/regeneration chamber 54. The trapped products are dissolved into the cleaning liquid or separated from the plates by the physical action of the cleaning liquid, and then follow the cleaning liquid, and are discharged from a cleaning liquid outlet port 44. Thus, the trapped products are removed. After the completion of cleaning, a drying gas, e.g., $N_2$ gas, is supplied into the trap/regeneration chamber 54 via the drying gas purge port 46, for thereby drying the trap unit 34 and the interior of the trap/regeneration chamber 54. Then, drying gas is discharged from the drying gas discharge port 48. After the completion of drying, the trap unit 34 is returned to the discharge path 16 side for next tapping operation.

The trap/regeneration chamber 54 is kept in a hermetically sealed state by the sealing materials 52 mounted on the valve elements 50, for thereby preventing contaminants from externally entering the discharge path 16 or the regeneration path 18 at the time of trapping or regeneration.

Figure 4:
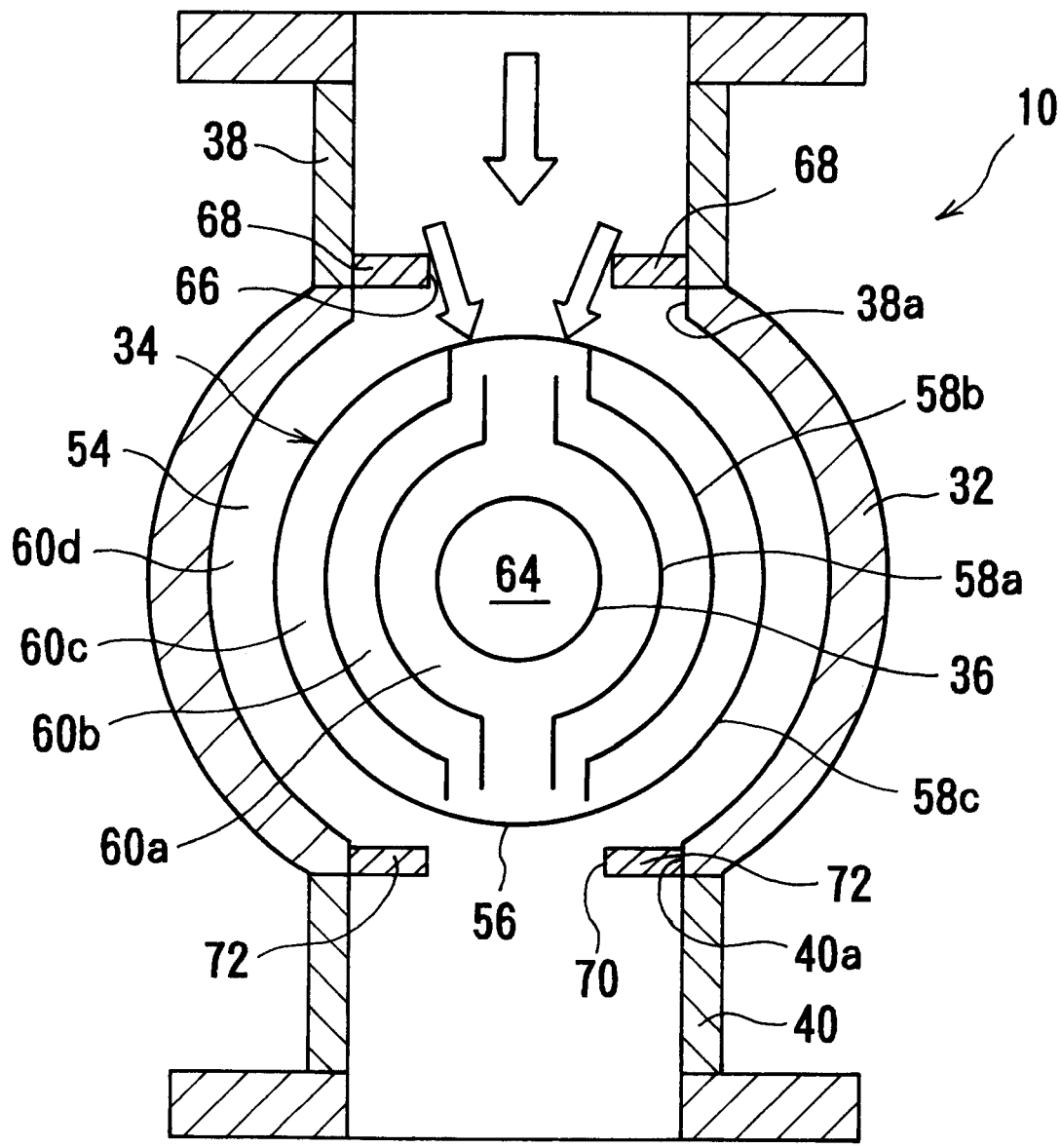
FIG. 4 is a sectional front view of a trap apparatus according to a second embodiment of the present invention.

FIG. 4 shows a trap apparatus according to a second embodiment of the present invention. In this embodiment, a pair of regulating plates 72, 72 are disposed at an outlet 40a in a trap container 32, and constitute an orifice 70 as a suppression section for suppressing the flow of a discharged gas. The orifice 70 reduces the width of the outlet 40a to suppress the flow of the discharged gas flowing through the outlet 40a. The other structure is the same as that of the first embodiment of the present invention.

According to the second embodiment of the present invention, the discharged gas which is discharged from the hermetically sealed chamber 12 flows into and through the trap container 32, and exits from the outlet 40a. At that time, the flow of the discharged gas is suppressed by the orifice (suppression section) 70. With the above arrangement, the discharged gas stays within the trap container 32 for a longer period of time. Further, in addition to the above-mentioned effect of increasing the proportion of discharged gas which flows through the trap passages 60a, 60b, 60c located on the center side and having good trapping efficiency, the effect of prolonging the time of contact of the discharged gas with the trap surface on the inner and outer surfaces of the baffle plates 58a, 58b, 58c in the trap unit 34 can further increase the trapping efficiency.

Figure 5:
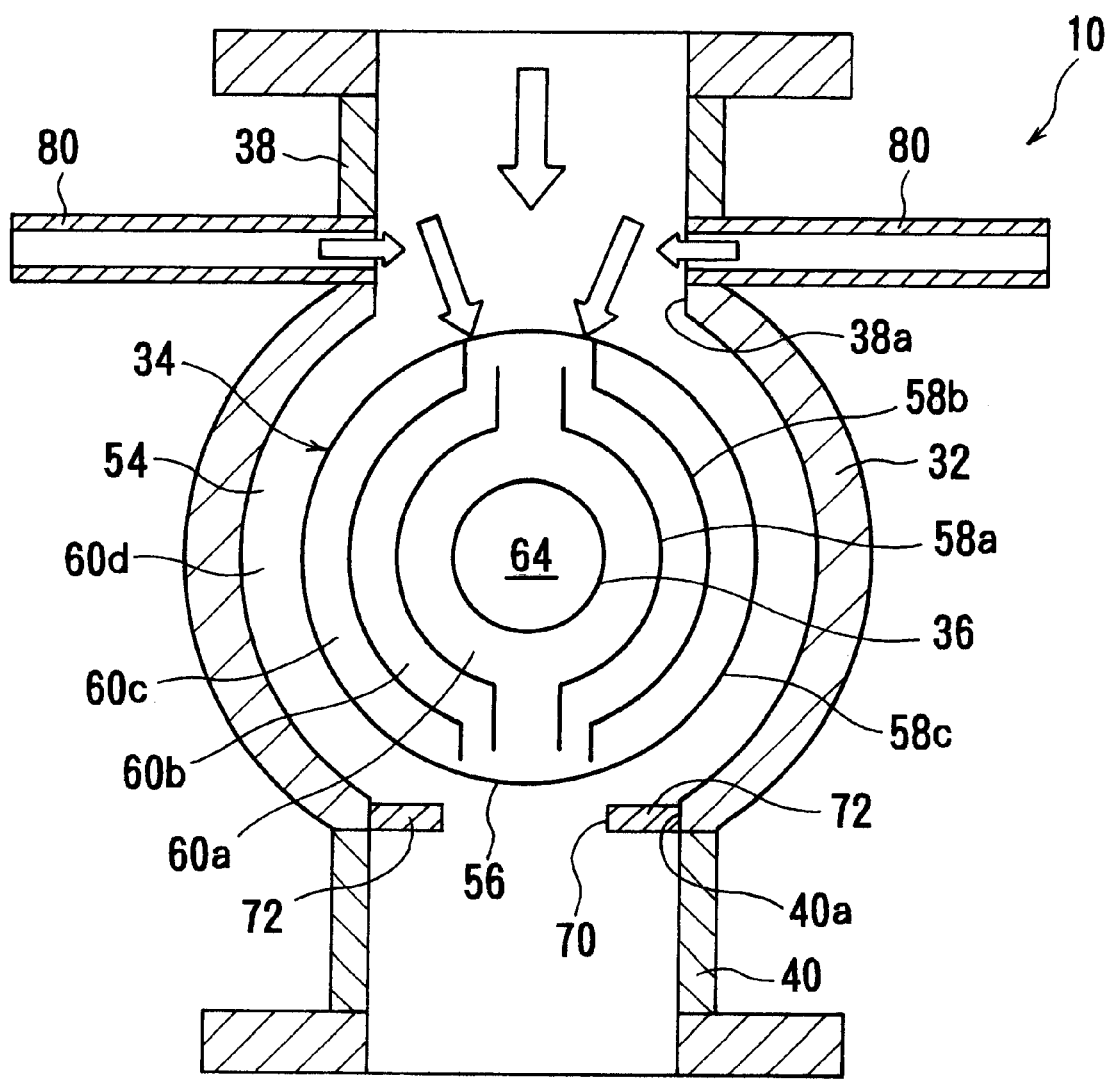
FIG. 5 is a sectional front view of a trap apparatus according to a third embodiment of the present invention.

FIG. 5 shows a trap apparatus according to a third embodiment of the present invention. The trap apparatus comprises, instead of the orifice (throttle section) 62 in the second embodiment, flow control gas ports 80 formed in right and left walls at the inlet 38a in the trap container 32 for supplying a flow control gas in a direction perpendicular to the discharged gas stream. The flow control gas ports 80 are connected to a flow control gas source which supplies an inert gas such as nitrogen under predetermined pressure and flow rate conditions. The pressure and flow rate of the flow control gas supplied from the flow control gas port 80 are set so that the flow control gas flows only through the outermost trap passage 60d. The other structure is the same as that of the second embodiment of the present invention.

According to this embodiment, the discharged gas discharged from the hermetically sealed chamber 12 together with the flow control gas having a predetermined pressure and a flow rate which is introduced from the right and left flow control gas ports 80 at the inlet 38a in the trap container 32 flows into the trap container 32. Therefore, the discharged gas flows mainly through the trap passages 60a, 60b, 60c on the center side, and hardly flows through the outermost trap passage 60d. On the other hand, the flow control gas flows mainly through the outermost trap passage 60d, and hardly flows through the trap passages 60a, 60b, 60c located on the inner side of the trap passage 60d.

Thus, since the discharged gas hardly flows through the outermost trap passage 60d on the wall side of the trap container 32 having substantially no trapping capability, trapping efficiency can be prevented from being lowered. As in the case of the second embodiment, in addition to the effect that the discharged gas stays longer within the trap container 32 because of suppression of the flow by the orifice (suppression section) 70 when the discharged gas flows through the trap container 32 and exits from the outlet 40a, the above effect in the third embodiment can further increase the trapping efficiency.

Figure 6:
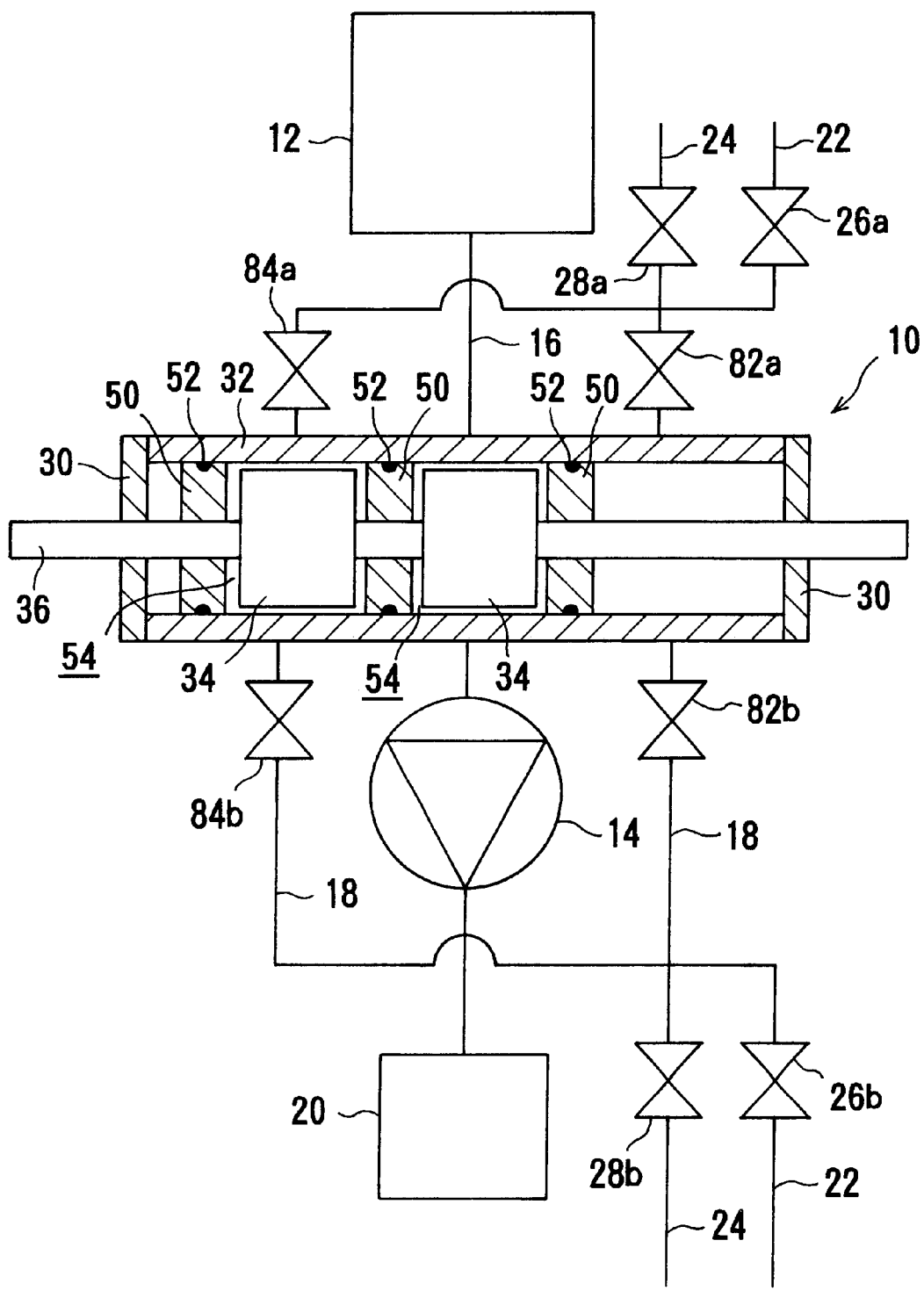
FIG. 6 is a systematic diagram showing an evacuating system having a trap apparatus according to a fourth embodiment of the present invention.
Figure 7:
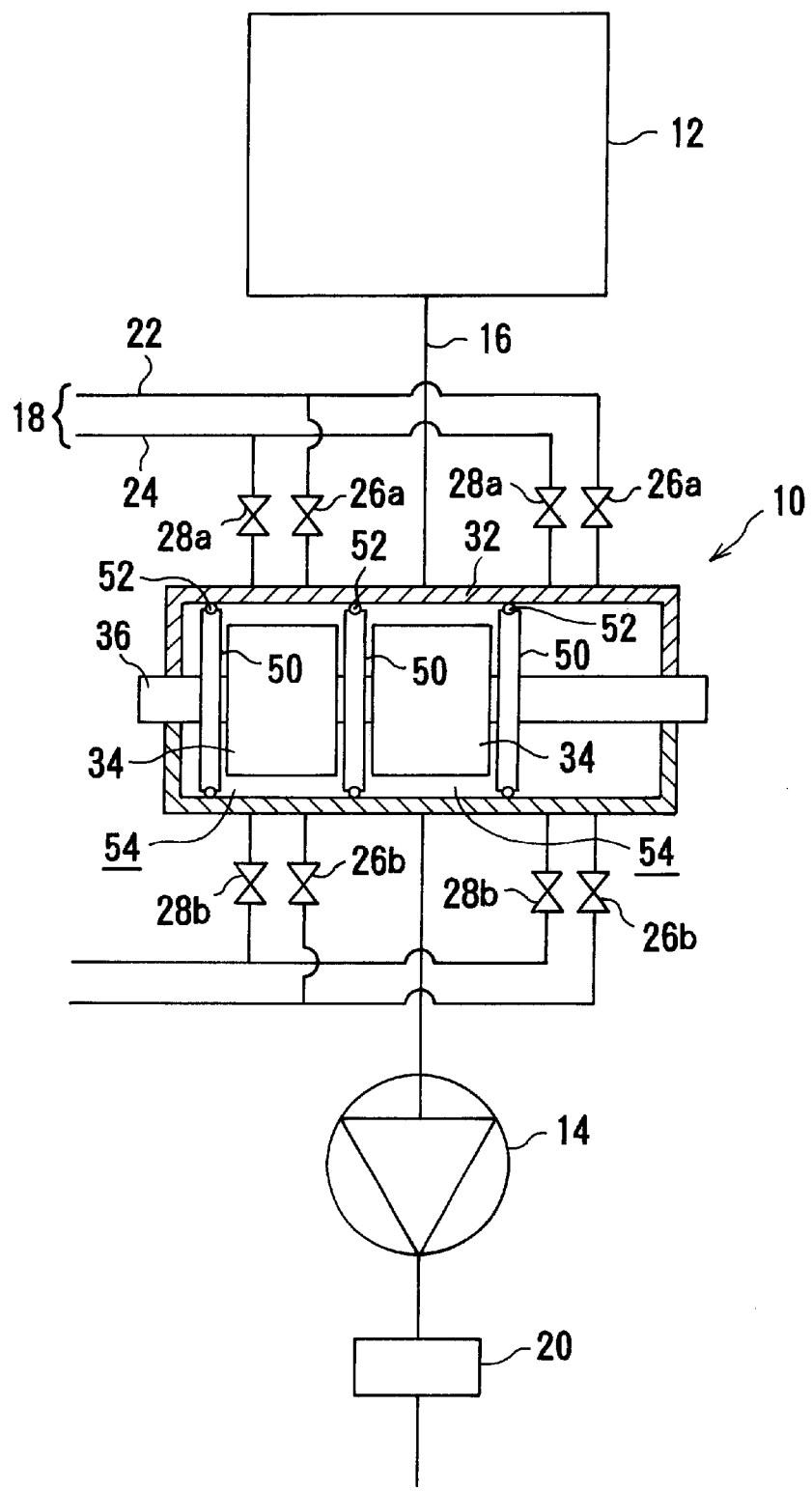
FIG. 7 is a systematic diagram showing an evacuating system having a trap apparatus according to a fifth embodiment of the present invention.

FIG. 6 shows a trap apparatus according to a fourth embodiment of the present invention. In the trap apparatus 10, regeneration positions are provided on both sides of the discharge position in the trap container 32. The discharge path 16 is connected to the discharge position, and the regeneration paths 18 are connected to the two regeneration positions. The shaft 36 has two trap units 34, 34 and three valve elements 50, 50, 50 disposed respectively on the left side of the left trap unit 34, on the right side of the right trap unit 34, and between the trap units 34, 34. The sealing material 52 is mounted on the seal mounting groove 51 (see FIG. 2B) provided on the outer circumferential surface of each of the valve elements 50. Thus, the three valve elements 50, 50, 50 and the inner wall of the trap container 32 define two trap/regeneration chambers 54, 54 each hermetically sealed by the sealing materials 52.

In this embodiment, a cleaning liquid line 22 having control valves 26a, 26b joins a drying gas line 24 having control valves 28a, 28b, and then the joined line is branched into two regeneration paths 18, 18 which enter the trap apparatus 10. The branched regeneration paths join each other at a downstream side of the trap apparatus 10, and then the joined path is branched into the cleaning liquid line 22 and the drying gas line 24. Control valves 82a, 82b, 84a, 84b are provided upstream and downstream of the trap apparatus 10 on the regeneration paths 18, 18.

According to this embodiment, in the state shown in FIG. 6, the left trap unit 34 is located within the left regeneration path 18 and regenerated. The right trap unit 34 is located within the discharge path 16 and performs trapping. Thereafter, the shaft 36 is moved so that the left trap unit 34 is located within the discharge path 16 and performs trapping, and the right trap unit 34 is located within the right regeneration path 18 and regenerated. Thus, switching between regeneration operation and trapping operation can allow a continuous trapping operation, and eliminate the need to stop the device for the regeneration of the trap unit 34 and to prepare a trap unit for replacement even in the case of operation for a long period of time, and allow continuous processing of the hermetically sealed chamber 12.

FIGS. 7 through 10B show a trap apparatus according to a fifth embodiment of the present invention. The structure of the trap apparatus 10 shown in FIGS. 7 through 10B is basically the same as that of the trap apparatus shown in FIG. 6. Specifically, regeneration positions are provided on both sides of the discharge position in the trap container 32. The discharge path 16 is connected to the discharge position, and the regeneration paths 18 are connected to the two regeneration positions. The shaft 36 has two trap units 34, 34 and three valve elements 50, 50, 50 disposed respectively on the left side of the left trap unit 34, on the right side of the right trap unit 34, and between the trap units 34, 34. The sealing material 52 is mounted on the seal mounting groove 51 provided on the outer circumferential surface of each of the valve elements 50. Thus, the three valve elements 50, 50, 50 and the inner wall of the trap container 32 define the two trap/regeneration chambers 54, 54 each hermetically sealed by the sealing material 52.

Figure 9:
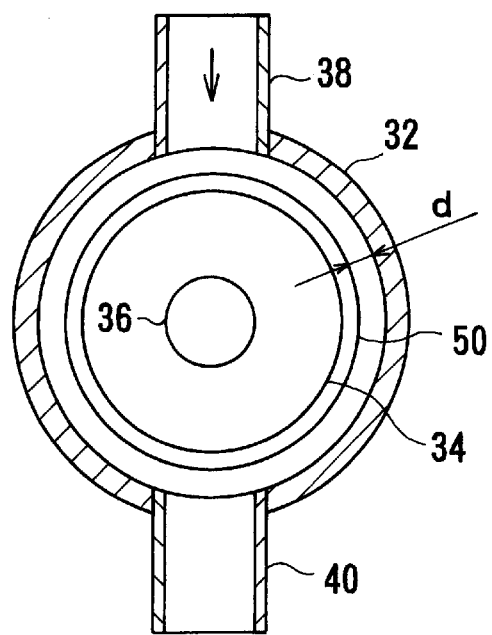
FIG. 9 is a cross-sectional view taken along a line A—A in FIG. 8.

In this embodiment, a cleaning liquid line 22 having control valves 26a, 26b and a drying gas line 24 having control valves 28a, 28b are separately connected to the trap apparatus 10. In this embodiment, the outer diameter of the trap unit 34 can be designed to be a near value to the inner diameter of the trap container 32. Therefore, as shown in FIG. 9, the clearance d may be made smaller to increase the trapping efficiency.

Figure 10A:
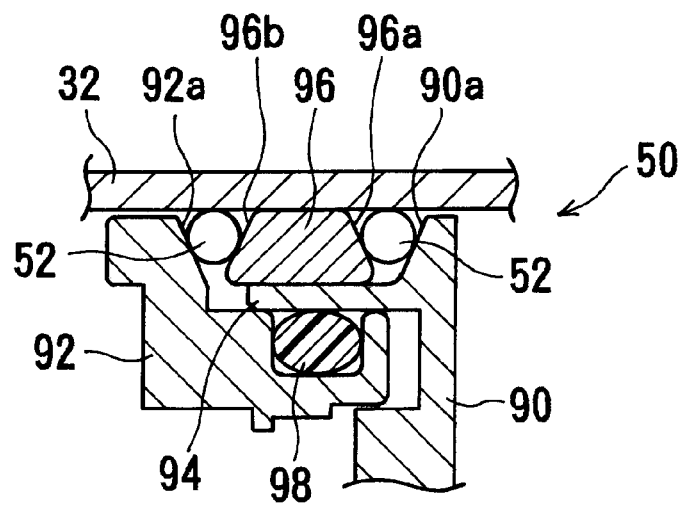
FIG. 10A is a cross-sectional view showing means for radially expanding a sealing material disposed in the trap apparatus shown in FIG. 8 when a valve element is in the movement state.
Figure 10B:
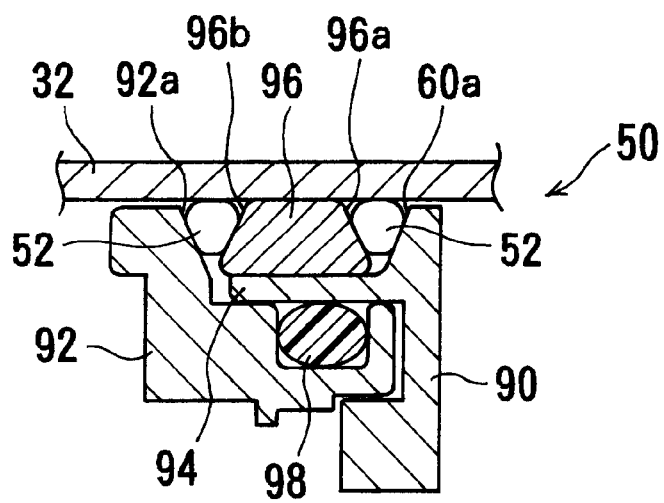
FIG. 10B a cross-sectional view showing means for radially expanding a sealing material disposed in the trap apparatus shown in FIG. 8 when the valve element is in a stop state (a sealed state)

As shown in detail in FIGS. 10A and 10B, the valve element 50 has a pair of disks 90, 92. The disks 90, 92 are movable toward such a direction that the disks 90, 92 are relatively brought into contact with each other or separated from each other by driving a cylinder (not shown) as driving means for moving and reciprocating the shaft 36 (see FIGS. 7 through 9). One of the disks, the disk 90, has a cylindrical section 94 extending toward the other disk 92. A movable ring 96 having a steeple cross-sectional shape is loosely engaged with the outer circumferential surface of the cylindrical section 94. Further, a packing 98 is interposed between the disks 90, 92 so as to be located on the inner circumferential surface of the cylindrical section 94.

Further, a tapered surface 90a is formed in the disk 90 at a portion facing one tapered surface 96a of the movable ring 96 in such a state that a space defined by the tapered surface 90a and 96a is outwardly widened to form a V shape in horizontal cross-section. A tapered surface 92a is formed in the disk 90 at a portion facing the other tapered surface 96b of the disk 92 in such a state that a space defined by the tapered surface 92a and 96b is outwardly widened to form a V shape in horizontal cross-section. Two sealing materials 52, 52 are disposed so as to respectively abut against the tapered surfaces 90a and 96a facing each other and against the tapered surfaces 92a and 96b facing each other.

Thus, as shown in FIG. 10A, when a pair of the disks 90, 92 are moved away from each other, one of the sealing materials 52 is accommodated in a region surrounded by the tapered surfaces 90a and 96a, and the other sealing material 52 is accommodated in a region surrounded by the tapered surfaces 92a and 96b. In this case, the sealing materials 52 are accommodated so that the outer circumferential surface of the sealing materials 52 is protruded outwardly to a slight extent. When a pair of the disks 90, 92 are then moved nearer to each other, as shown in FIG. 10B, the sealing materials 52 are pressed against the tapered surfaces 90a, 96a, 92a, 96b and hence expanded radially, so that one of the sealing materials 52 is brought into close contact with three surfaces, the tapered surfaces 90a, 96a and the inner circumferential surface of the trap container 32, as in the case of a so-called triangular groove. Likewise, the other sealing material 52 is brought into close contact with three surfaces, the tapered surfaces 92a, 96b and the inner circumferential surface of the trap container 32. Thus, reliable sealing and a double seal structure can be achieved.

In this embodiment, the tapping operation and the regeneration operation are basically performed in the same manner as those the fourth embodiment shown in FIG. 6. However, before the cylinder (not shown) is driven to move the shaft 36, the disks 90, 92 of the valve elements 50 are moved away from each other, so that the sealing materials 52 is respectively accommodated into a region surrounded by the tapered surfaces 90a, 96a and a region surrounded by the tapered surfaces 92a, 96b. After the shaft 36 is moved, a pair of the disks 90, 92 are moved nearer to each other, so that the sealing materials 52 are respectively pressed against the tapered surfaces 90a, 96a and against the tapered surfaces 92a, 96b, and hence expanded radially. Thus, the sealing materials 52 are respectively brought into close contact with three surfaces, the tapered surfaces 90a, 96a and the inner circumferential surface of the trap container 32, and with three surfaces, the tapered surfaces 92a, 96b and the inner circumferential surface of the trap container 32 to perform sealing.

As describe above, the sealing materials 52 are expanded radially and brought into close contact with the inner circumferential surface of the trap container 32, and hence sufficient hermetical sealing can be achieved when the valve elements 50 are in a stop state (a sealed state). Further, when the valve elements 50 are moved, the sealing materials 52 are contracted radially to reduce the protrusion from the outer circumferential surface of the valve elements 50. Thus, frictions of the sealing materials 52 caused by sliding at the time of movement of the valve elements 50 and loads such as impact caused when the sealing materials 52 pass between different portions such as the inlet pipe 38, the outlet pipe 40, the cleaning liquid inlet port 42, the cleaning liquid outlet port 44, the drying gas purge port 46, and the drying gas discharge port 48, can be reduced, so that durability of the sealing materials 52 can be increased.

In this embodiment, a double seal structure is formed. However, the movable ring used in this embodiment may be omitted to form a single seal structure that a single sealing material is disposed between respective tapered surfaces in a pair of disks.

Figure 11:
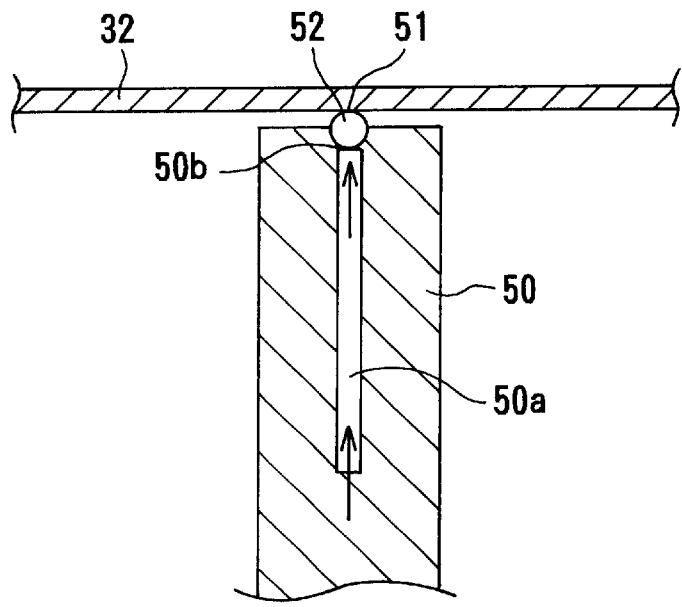
FIG. 11 is a cross-sectional view showing the principal part of second means for radially expanding a sealing material according to the present invention.

FIG. 11 is a second modified embodiment of the fifth embodiment. As shown in FIG. 11, the sealing material 52 can be expanded radially. In FIG. 11, the valve element 50 has a gas flow groove 50a therein, and the gas flow groove 50a is communicated with a seal mounting groove 51 provided on the outer circumferential surface of the valve element 50 via a through-hole 50b. In this modified embodiment, when the valve element 50 is in a stop state (a sealed state), a pressurized gas is introduced into the gas flow groove 50a to press the sealing material 52 outwardly and expand the sealing material 52 radially with its gas pressure, and hence the sealing material is brought into close contact with the inner circumferential surface of the trap container 32. When the valve element 50 is moved, the introduction of the gas is stopped, and the sealing material 52 is contracted radially by the elastic force of the sealing material 52 to reduce the outward protrusion thereof, thereby reducing loads on the sealing material 52 caused by sliding.

Figure 12A:
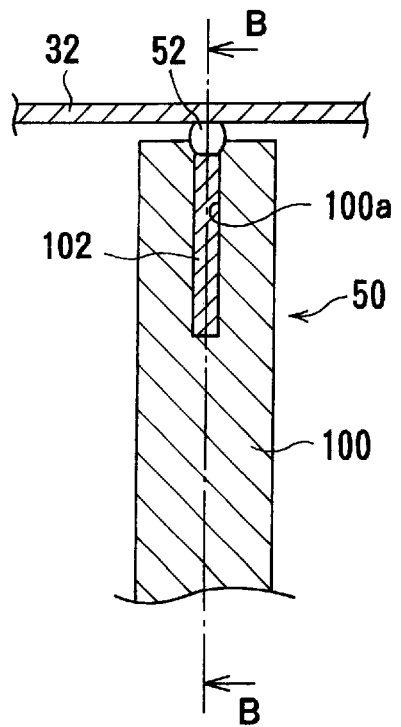
FIG. 12A is a cross-sectional view of third means for radially expanding a sealing material according to the present invention.
Figure 12B:
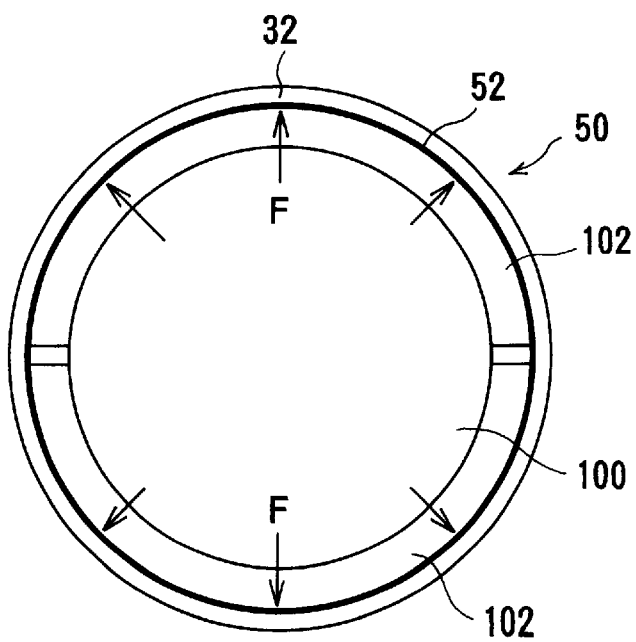
FIG. 12B a cross-sectional view taken along a line B—B of FIG. 12A.

FIGS. 12A and 12B show a third modified embodiment of the fifth embodiment. As shown in FIGS. 12A and 12B, the sealing material 52 can be expanded radially. A ring-like circumferential groove 100a is provided on the outer circumferential surface of a disk-like body 100, and a half-split bimetal 102 is loosely engaged with the interior of the circumferential groove 10a to constitute a valve element 50. The bimetal 102 is opened outwardly by being heated or being supplied with a current, for example. In this modified embodiment, when the valve element 50 is in a stop state (a sealed state), the bimetal 102 is heated or supplied with a current, and hence opened outwardly with force F. Thus, the sealing material 52 is pressed outwardly by the force F of the bimetal 102 and expanded radially, and hence brought into close contact with the inner circumferential surface of the trap container 32. When the valve element 50 is then moved; the heating or the supplement of a current is stopped, and the sealing material 52 is contracted radially by the elastic force of the sealing material 52 to reduce the outward protrusion thereof, thereby reducing loads on the sealing material 52 caused by sliding.

Figure 8:
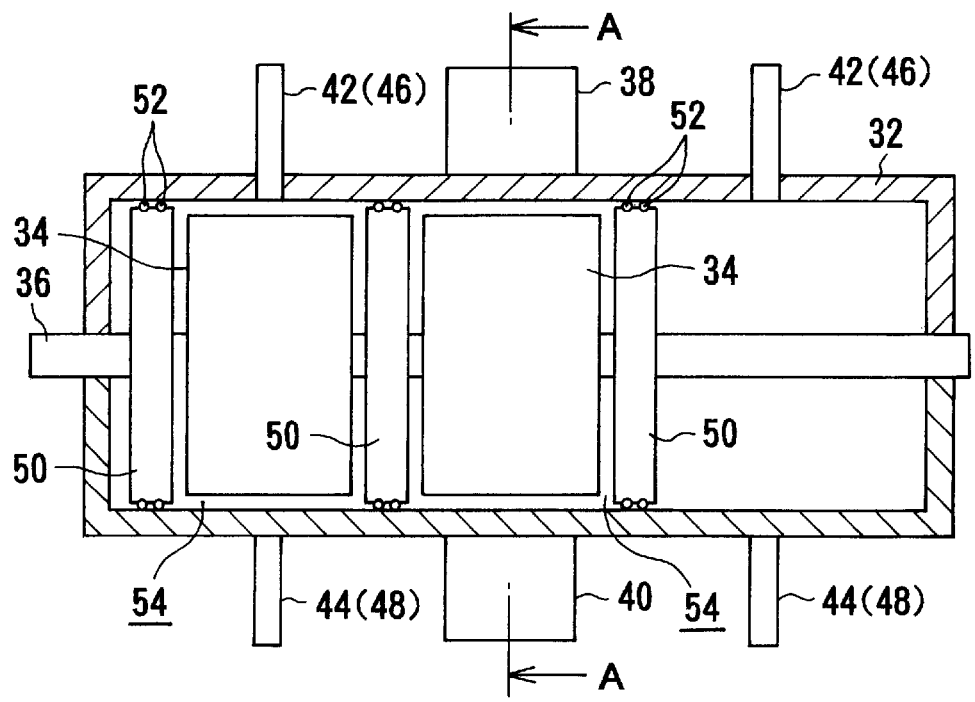
FIG. 8 is a cross-sectional view showing the principal part of the trap apparatus shown in FIG. 7.
Figure 13A:
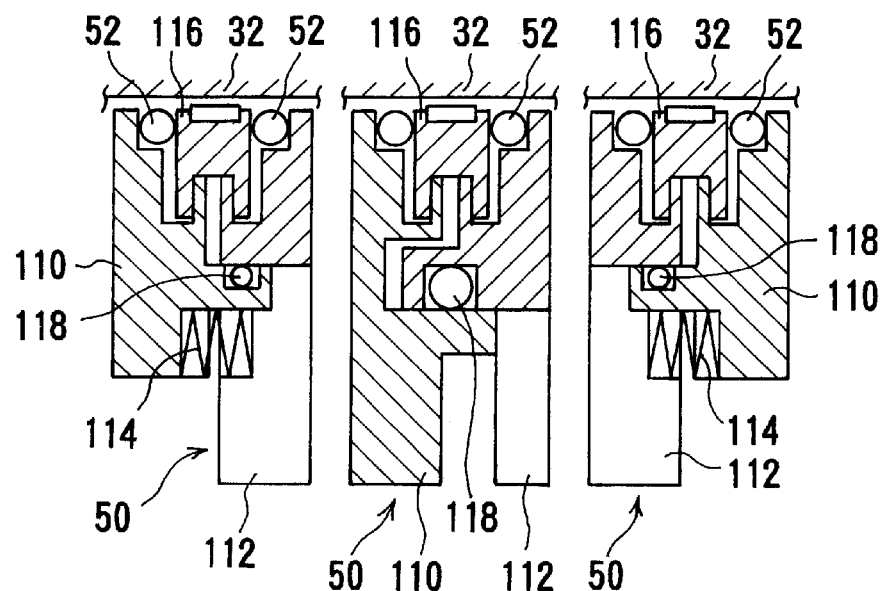
FIG. 13A is a cross-sectional view of fourth means for radially expanding a sealing material according to the present invention when a valve element is in a movement state.
Figure 13B:
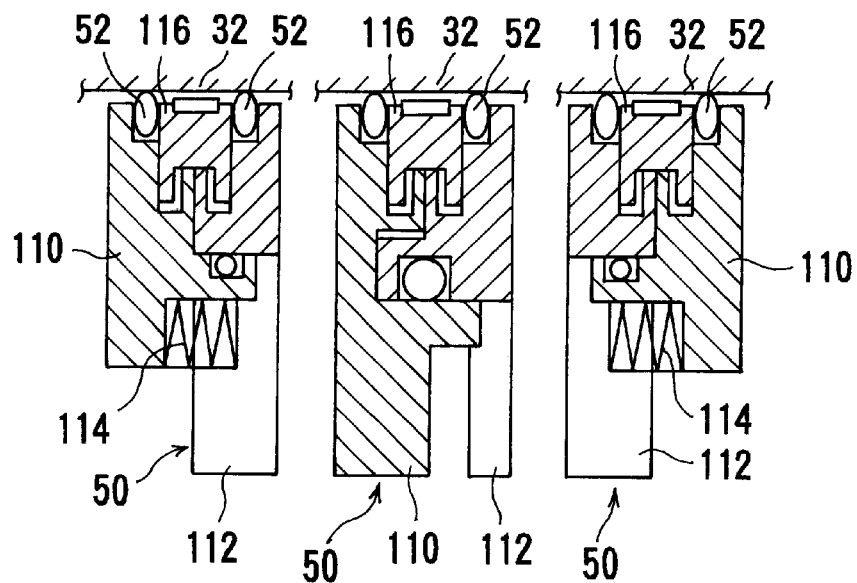
FIG. 13B a cross-sectional view of fourth means for radially expanding a sealing material when the valve element is in a stop state (a sealed state)

FIGS. 13A and 13B show a fourth modified embodiment of the fifth embodiment. As shown in FIGS. 13A and 13B, the sealing materials 52 can be expanded radially. In FIGS. 13A and 13B, all the three valve elements 50 shown in FIG. 8 are shown. Each of the valve elements 50 comprises a pair of disks 110, 112. The valve element 50 located on the right side and the valve element 50 located on the left side have a spring 114 interposed between the disks 110, 112 for applying a force to the disks 110, 112 to move the disks 110, 112 away from each other. Thus, the disks 110, 112 are relatively movable away from and nearer to each other by the elastic force of the spring 114 and driving of a cylinder as driving means for reciprocating the shaft 36 (see FIG. 8).

A ring 116 is disposed at a position between the disks 110, 112. Sealing materials 52 are respectively disposed at a position between the ring 116 and the disks 110, 112. Further, a packing 118 is interposed between the disks 110, 112.

As shown in FIG. 13A, in such a state that a pair of the disks 110, 112 are moved away from each other, the sealing materials 52 are respectively accommodated into regions defined by both sides of the ring 116 and the disks 110, 112 without collapse. Specifically, the sealing materials 52 are not in contact with the inner circumferential surface of the trap container 32, and accommodated in a free state. When a pair of the disks 110, 112 are then moved nearer to each other, as shown in FIG. 13B, the sealing materials 52 are respectively pressed by the ring 116 and the disks 110, 112 and hence expanded radially, thus causing the outer circumferential surface of each of the sealing materials 52 to be brought into close contact with the inner circumferential surface of the trap container 32. Thus, reliable sealing and a double seal structure can be achieved.

In this modified embodiment, before the cylinder (not shown) is driven to move the shaft 36 (see FIG. 8), the disks 110, 112 in each of the valve elements 50 are moved away from each other, so that the sealing materials are respectively accommodated into regions defined by both sides of the ring 116 and the disks 110, 112 in a free state. After the shaft 36 is moved, a pair of the disks 110, 112 are moved nearer to each other, so that the sealing materials 52 are respectively pressed by the ring 116 and the disks 110, 112 and hence expanded radially. Thus, the outer circumferential surface of each of the sealing materials 52 is brought into close contact with the inner circumferential surface of the trap container 32 to perform sealing.

As described above, the sealing material 52 is expanded radially and brought into close contact with the inner circumferential surface of the trap container 32, and hence sufficient hermetical sealing can be achieved when the valve element 50 is in a stop state (a sealed state). Further, when the valve element 50 is moved, loads on the sealing material 52 can be minimized, so that durability of the sealing material 52 can be increased.

Figure 14A:
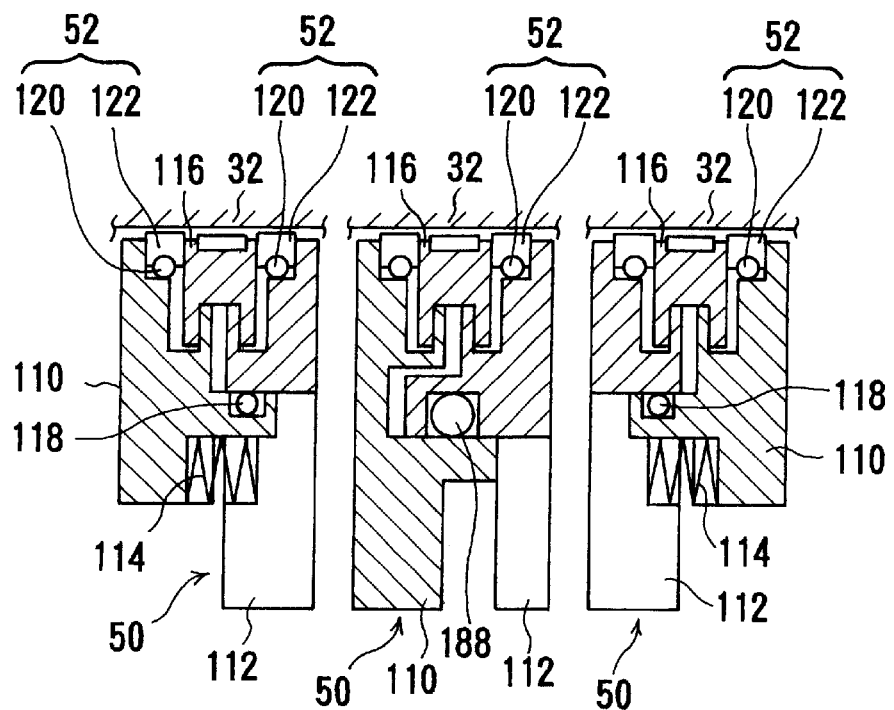
FIG. 14A is a cross-sectional view of fifth means for radially expanding a sealing material according to the present invention when a valve element is in a movement state.
Figure 14B:
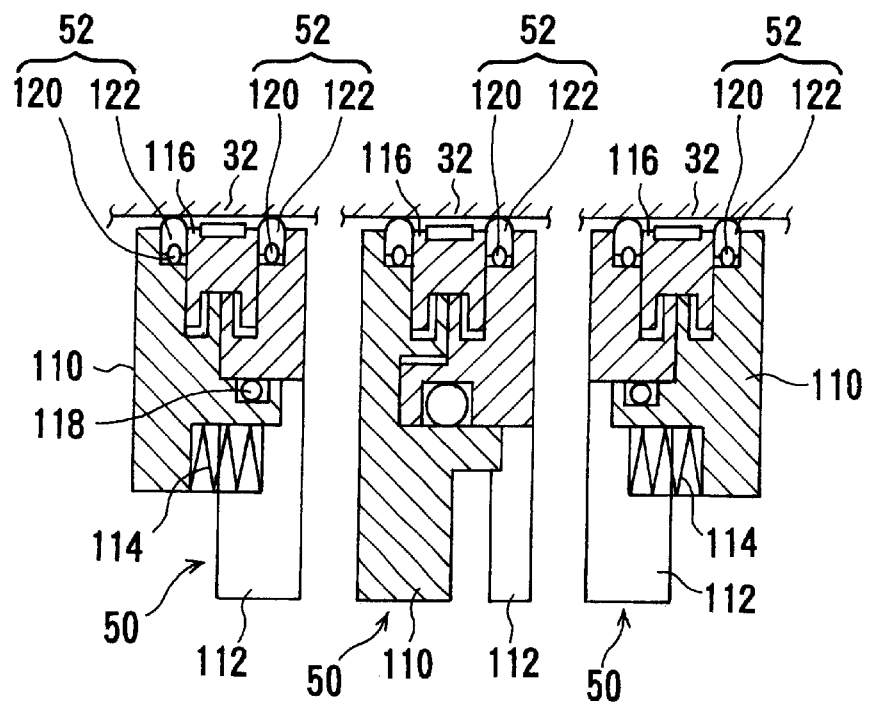
FIG. 14B a cross-sectional view of fifth means for radially expanding a sealing material when the valve element is in a stop state (a sealed state)

FIGS. 14A and 14B show a fifth modified embodiment of the fifth embodiment. As shown in FIGS. 14A and 14B, the sealing materials 52 can be expanded radially. The sealing material 52, i.e., a so-called cap-type sealing material, comprises an O-ring 120 and a covering material 122 for covering the outer circumferential portion of the O-ring 120 and protecting the O-ring 120. The cap-type sealing material has better durability. The other structure is the same as that shown in FIGS. 13A and 13B.

As shown in FIG. 14A, in such a state that a pair of the disks 110, 112 are moved away from each other, the sealing materials 52 are respectively accommodated into regions defined by both sides of the ring 116 and the disks 110, 112 without collapse. When a pair of the disks 110, 112 are then moved nearer to each other, as shown in FIG. 14B, the sealing materials 52 are respectively pressed by the ring 116 and the disks 110, 112 and hence expanded radially, thus causing the outer circumferential surface of each of the sealing materials 52 to be brought into close contact with the inner circumferential surface of the trap container 32. Thus, reliable sealing and a double seal structure can be achieved.

EXAMPLES

In a trap apparatus shown in FIGS. 1 through 3, width A×length in the orifice (the throttle section) 66 defined by the regulating plates 68, 68 was 46×125 mm (Example 1), 46×95 mm (Example 2), and 46×75 mm (Example 3), and the outermost baffle plate 58c had an outer diameter D of 117 mm and a length of 61 mm. In this trap apparatus, the trapping efficiency of $NH_4Cl$ and the conductance were measured. In this case, water of 25° C. was supplied as a cooling liquid into the heat medium path 64 in the shaft 36 at a flow rate of 2.5 L/min.

Figure 15:
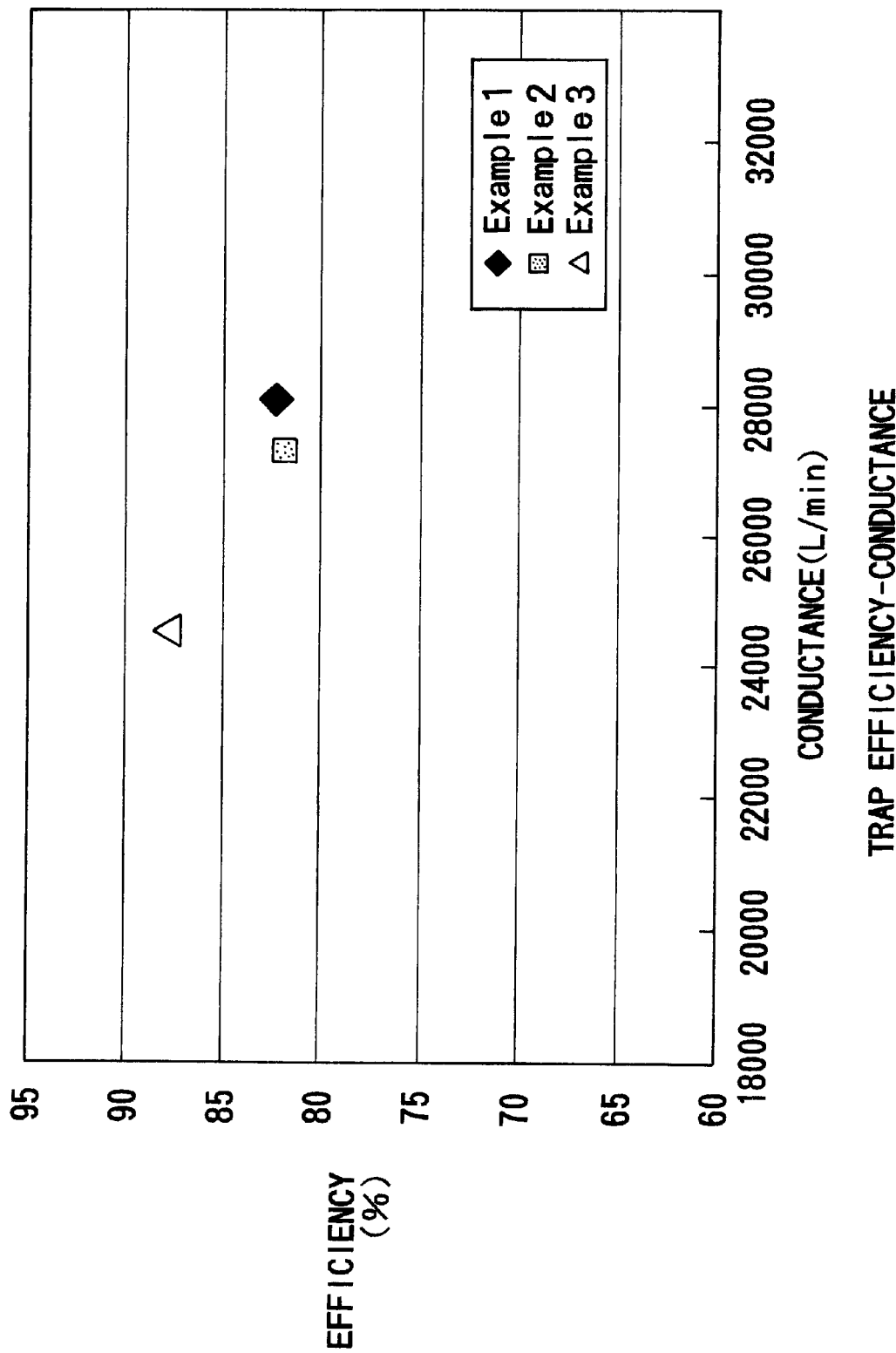
FIG. 15 is a graph showing the results of measurement of trapping efficiency and conductance in an evacuating system shown in FIGS. 1 through 3.
Figure 16:
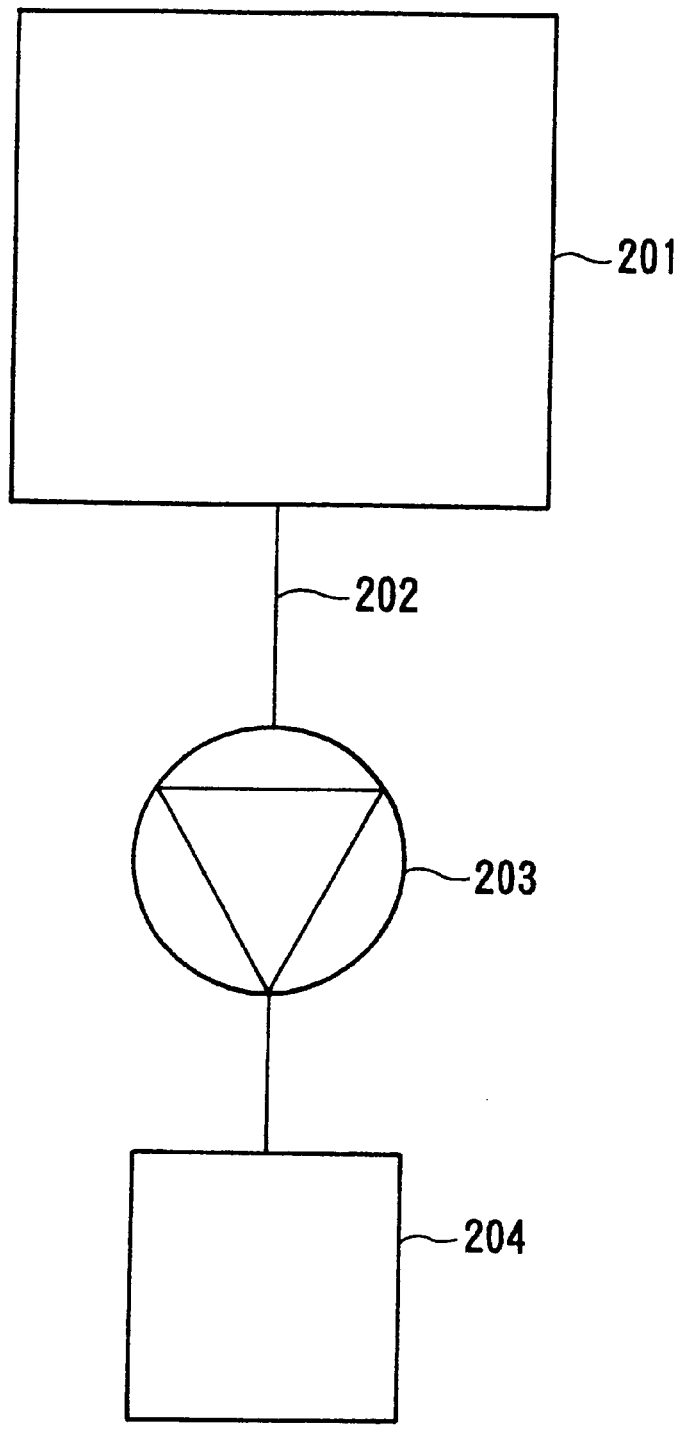
FIG. 16 is a systematic diagram showing a conventional evacuating system.

As a result, in Example 1, the trapping efficiency was 80%, and the conductance was 34,200 L/min in the initial stage and 27,500 L/min after trapping operation. In Example 2, the trapping efficiency was 83%, and the conductance was 32,100 L/min in the initial stage and 26,800 L/min after tapping operation. In Example 3, the trapping efficiency was 88%, and the conductance was 30,200 L/min in the initial stage and 24,200 L/min after tapping operation. These results are shown in FIG. 15.

As described above, according to the present invention, the contact efficiency of a discharged gas flowing into the trap container with the trap unit can be improved. Therefore, the trapping efficiency of products in the discharged gas can be increased while the conductance of the discharged gas is being maintained. Thus, in an evacuating system using this trap apparatus, the service life of the vacuum pump can be increased, and a toxic substance removing device is protected for increased operation reliability without affecting the performance of the vacuum pump, so that the equipment cost and the running cost of the whole system can be reduced.

Although certain preferred embodiments of the present invention have been shown and described in detail, it should be understood that various changes and modifications may be made therein without departing from the scope of the appended claims.

What is claimed is:

1. A trap apparatus, comprising:
   a discharge path for evacuating a hermetically sealed chamber through a vacuum pump;
   a hermetically sealed trap container extended across said discharge path and a regeneration path disposed adjacent to said discharge path;
   a trap unit disposed in said trap container for attaching a product in a discharged gas thereon and removing said product from said discharged gas, said trap unit being selectively located at said discharge path or said regeneration path;

a valve element disposed on both sides of said trap unit and being movable integrally with both sides of said trap unit and being movable integrally with said trap unit; and a sealing material mounted on an outer circumferential surface of said valve element so as to slide over an inner circumferential surface of said trap container when said trap unit is moved;

wherein said sealing material is mounted on an outer circumferential surface of said valve element so as to be expanded toward an inner circumferential surface of said trap container;

further wherein said valve element comprises means for radially expanding said sealing material by pressing said sealing material outwardly;

and still further wherein said means for radially expanding said sealing material relatively moves a pair of members facing with each other or a pair of members having a tapered surface away from and nearer to each other, said tapered surface facing with each other and having a V shape extending outwardly in horizontal cross-section.

2. A trap apparatus comprising:

a discharge path for evacuating a hermetically sealed chamber through a vacuum pump;

a hermetically sealed trap container having an inlet and an outlet and constituting a part of said discharge path;

a trap unit disposed in said trap container for attaching a product in a discharged gas thereon and removing said product from said discharged gas; and a suppression section disposed at a discharge port of said trap container for suppressing a flow of a discharged gas in said discharge port.

3. The trap apparatus according to claim 2, wherein said trap unit comprises a baffle plate having a curved trap surface.

4. A trap apparatus according to claim 3, wherein said trap surface is in the shape of an arc, an axis of said arc crossing said discharge path.

* * * * *